United States Patent
Ishii et al.

(10) Patent No.: US 9,059,343 B2
(45) Date of Patent: Jun. 16, 2015

(54) RADIATION IMAGE PICKUP APPARATUS, RADIATION IMAGE PICKUP SYSTEM, AND METHOD FOR MANUFACTURING RADIATION IMAGE PICKUP APPARATUS

(75) Inventors: Takamasa Ishii, Honjo (JP); Masato Inoue, Kumagaya (JP); Masayoshi Akiyama, Yokohama (JP); Shinichi Takeda, Honjo (JP); Satoru Sawada, Fujioka (JP); Taiki Takei, Okegawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 13/806,344

(22) PCT Filed: Jun. 13, 2011

(86) PCT No.: PCT/JP2011/003342
§ 371 (c)(1),
(2), (4) Date: Dec. 21, 2012

(87) PCT Pub. No.: WO2011/161897
PCT Pub. Date: Dec. 29, 2011

(65) Prior Publication Data
US 2013/0099344 A1   Apr. 25, 2013

(30) Foreign Application Priority Data

Jun. 23, 2010 (JP) ................. 2010-142950

(51) Int. Cl.
*H01L 31/0232* (2014.01)
*G01T 1/20* (2006.01)
(Continued)

(52) U.S. Cl.
CPC .......... *H01L 31/0232* (2013.01); *G01T 1/2018* (2013.01); *H01L 31/18* (2013.01); *H01L 27/14618* (2013.01); *H01L 27/14663* (2013.01)

(58) Field of Classification Search
CPC . H01L 31/18; H01L 31/0232; H01L 31/1884; H01L 31/022425; Y02E 10/50
USPC .................. 257/432, E21.502; 438/48, 15, 64
See application file for complete search history.

(56) References Cited

U.S. PATENT DOCUMENTS

| 2002/0038851 | A1 | 4/2002 | Kajiwara et al. | |
| 2010/0021668 | A1* | 1/2010 | Shimokawa et al. | 428/40.2 |
| 2010/0108893 | A1* | 5/2010 | Flitsch et al. | 250/361 R |

(Continued)

FOREIGN PATENT DOCUMENTS

| JP | 6184504 A | 7/1994 |
| JP | 2009133837 A | 6/2009 |

(Continued)

*Primary Examiner* — Andy Huynh
(74) *Attorney, Agent, or Firm* — Canon USA Inc. IP Division

(57) ABSTRACT

A radiation image pickup apparatus includes a base, at least one image pickup element, a scintillator, a first heat peelable adhesive layer which is arranged between the base and the image pickup element and which fixes the base and the image pickup element, and a second heat peelable adhesive layer which is arranged between the image pickup element and the scintillator and which fixes the image pickup element and the scintillator, and in the radiation image pickup element described above, the first heat peelable adhesive layer contains first heat-expandable microspheres, the second heat peelable adhesive layer contains second heat-expandable microspheres, and the first heat-expandable microspheres have a different expansion starting temperature from that of the second heat-expandable microspheres.

15 Claims, 10 Drawing Sheets

(51) Int. Cl.
*H01L 31/18* (2006.01)
*H01L 27/146* (2006.01)

(56) References Cited

U.S. PATENT DOCUMENTS

2010/0155612 A1* 6/2010 Takeda et al. ............ 250/370.08
2010/0193691 A1* 8/2010 Ishii et al. ..................... 250/366
2010/0243908 A1* 9/2010 Shoji et al. ............... 250/370.11

FOREIGN PATENT DOCUMENTS

| WO | 2008072462 A1 | 6/2008 |
| WO | 2008/142135 A1 | 11/2008 |
| WO | 2009031574 A1 | 3/2009 |

* cited by examiner

RADIATION IMAGE PICKUP APPARATUS, RADIATION IMAGE PICKUP SYSTEM, AND METHOD FOR MANUFACTURING RADIATION IMAGE PICKUP APPARATUS

TECHNICAL FIELD

The present invention relates to a radiation image pickup apparatus detecting radiation rays, a radiation image pickup system, and a method for manufacturing a radiation image pickup apparatus, and more particularly relates to a radiation image pickup apparatus used for a medical image diagnosis apparatus, a nondestructive inspection apparatus, an analysis apparatus, and the like.

BACKGROUND ART

At the moment, a single crystal semiconductor wafer which is generally commercially available is small in size as compared to a glass substrate. Hence, in order to form a large-area detector using a single crystal semiconductor wafer, a single crystal semiconductor wafer in which detection elements are formed is divided to form a plurality of image pickup element chips, and an appropriate number of the image pickup element chips are arranged to form a detector having a desired area.

PTL 1 has disclosed that in order to reduce cost, before image pickup element chips are adhered to a base board which functions as a part of an apparatus, the image pickup element chips are inspected, and an image pickup element chip which is detected as a defective element, if any, is exchanged. In addition, it has also been disclosed that after the inspection and the exchange are performed, the image pickup element chips are fixed to the base board by adhesion.

Furthermore, PTL 2 has disclosed that for rework of a liquid-crystal display device, a double-sided adhesive sheet, which includes at least one heat peelable adhesive layer containing heat-expandable microspheres, is used for fixing a liquid-crystal display module unit and a back light unit.

CITATION LIST

Patent Literature

PTL 1: U.S. Patent Application Publication No. 2002-0038851
PTL 2: International publication No. 2008-072462

SUMMARY OF INVENTION

Technical Problem

However, by the method disclosed in PTL 1, after a plurality of image pickup element chips is adhered to the base board, it is difficult to exchange one or more defective image pickup element chips which are discovered by inspection. For example, when a defective image pickup element chip is peeled off, an image pickup element chip having no defect may be fractured by an external stress applied thereto in some cases. In addition, properties of an image pickup element chip having no defect may be degraded in some cases by a solvent used for dissolving an adhesive.

In addition, PTL 2 has disclosed simple peeling between two components fixed to each other of a liquid crystal display device.

Hence, the structure has been required in which in a multilayer structure formed of at least two constituent elements and at least one image pickup element provided therebetween, the image pickup element can be easily exchanged.

The present invention was made in consideration of the problems as described above and provides a radiation image pickup apparatus in which one or more image pickup elements can be easily exchanged.

Solution to Problem

Accordingly, the present invention provides a radiation image pickup apparatus which comprises: a base; at least one image pickup element including a plurality of pixels, each of which has a sensor portion converting light into a charge; a scintillator arranged on the image pickup element at a side opposite to the base; at least one first heat peelable adhesive layer which is arranged between the base and the image pickup element and which fixes the base and the image pickup element; and a second heat peelable adhesive layer which is arranged between the image pickup element and the scintillator and which fixes the image pickup element and the scintillator, wherein the first heat peelable adhesive layer contains first heat-expandable microspheres, the second heat peelable adhesive layer contains second heat-expandable microspheres, and the first heat-expandable microspheres have a different expansion starting temperature from that of the second heat-expandable microspheres.

Advantageous Effects of Invention

According to the present invention, a radiation image pickup apparatus in which one or more image pickup elements are easily exchanged can be obtained.

DESCRIPTION OF EMBODIMENTS

Hereinafter, embodiments of a radiation image pickup apparatus, a radiation image pickup system, and a method for manufacturing a radiation image pickup apparatus, according to the present invention, will be described with reference to the drawings.

In the present invention, light includes visible light and infrared light, and radiation rays include X-rays, alpha rays, beta rays, and gamma rays.

Embodiment 1

Figure 1A:
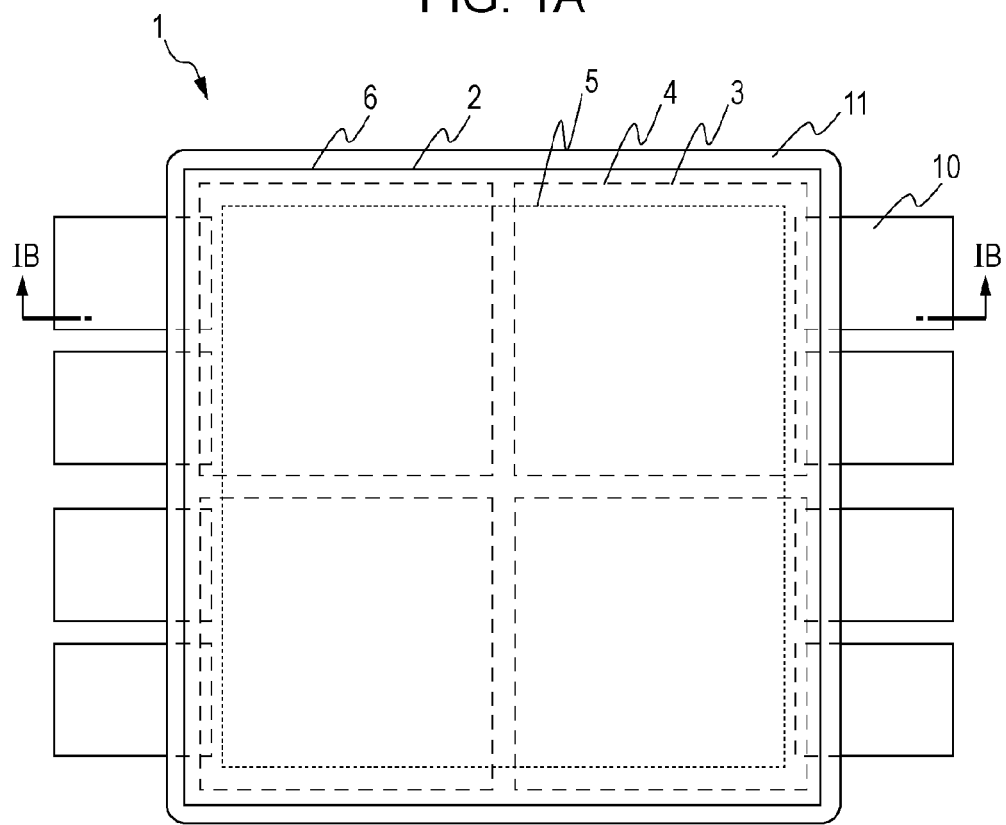
FIG. 1A is a plan view of a radiation image pickup apparatus according to Embodiment 1.
Figure 1B:
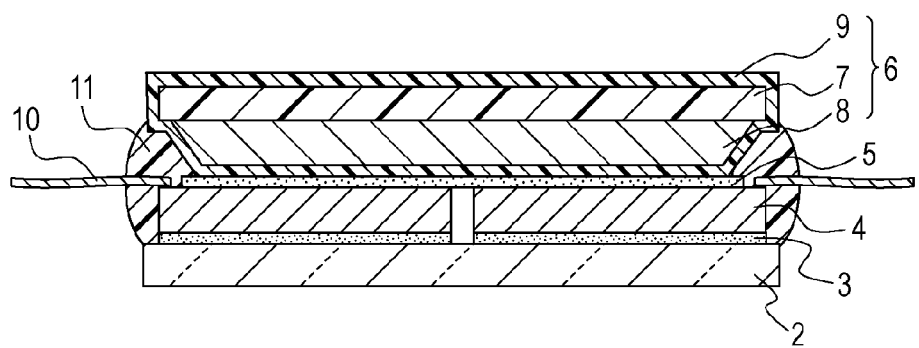
FIG. 1B is a cross-sectional view of the radiation image pickup apparatus according to Embodiment 1.

FIGS. 1A and 1B each show a radiation image pickup apparatus according to this embodiment. FIG. 1A is a plan view of the radiation image pickup apparatus, and FIG. 1B is a cross-sectional view of the radiation image pickup apparatus taken along the line IB-IB of FIG. 1A.

As shown in FIGS. 1A and 1B, a radiation image pickup apparatus 1 has a base 2, four image pickup elements 4 fixed on the base 2 with first heat peelable adhesive layers 3 provided therebetween, and a scintillator 6 fixed on the image pickup elements 4 with a second heat peelable adhesive layer 5 provided therebetween. A wiring board 10 transferring a signal between the image pickup element and an external circuit (not shown) is fixed to the image pickup element 4. In order to reduce electrical and mechanical influences generated when the image pickup elements 4 come into contact with each other, the four image pickup elements 4 are arranged on the base 2 with spaces provided therebetween. In addition, the number of the image pickup elements 4 fixed on the base 2 is not limited to four, and one or more image pickup elements 4 may be arranged.

The image pickup elements 4 each have a plurality of pixels each having a switching element and a sensor portion. For example, there may be mentioned a CMOS sensor, a CCD sensor, an a-Si sensor having a pixel formed of a TFT and an MIS sensor or a PIN sensor using an amorphous silicon (hereinafter, simply referred to as "a-Si"), and an SOI (silicon on insulator) sensor. Although a flexible printed-circuit board (FPC) is suitably used for the wiring board 10, a rigid wiring board may also be used. The scintillator 6 has a substrate 7, a scintillator layer 8 which converts radiation rays, such as X-rays, into light which can be sensed by the image pickup element 4, and a protective layer 9. For the substrate 7, amorphous carbon (a-C), aluminum, a resin, or the like may be used. For the scintillator layer 8, a columnar crystal, such as CsI:Tl, or a particulate crystal, such as GOS, which converts radiation rays, such as X-rays, into light which can be sensed by the image pickup element 4 is used. In order to protect the scintillator layer 8 from moisture and/or impact from the outside, the protective layer 9 is formed from a polyparaxylylene, a hot melt resin, or the like. Although a glass is used for the base 2, quartz, a resin, such as an acrylic resin, a ceramic, a metal, or the like may also be used. The periphery of the radiation image pickup apparatus 1 is fixed between the base 2 and the scintillator 6 with a resin 11 so as to suppress the entry of moisture and the like from the outside, and the image pickup elements 4 are sealed inside. The wring board 10 is arranged to penetrate the resin 11. For the resin 11, an acrylic resin, an epoxy resin, a silicone resin, or the like is used, and a black resin which absorbs light is preferable. The reason for this is that when the base 2 transmits light having a wavelength to be sensed by the image pickup element 4, light from a light emitting element of a different circuit board is prevented from entering the image pickup element 4 as stray light, and the image quality is suppressed from being degraded. The first heat peelable adhesive layer 3 containing first heat-expandable microspheres is arranged in order to fix the base 2 and the image pickup element 4 and to enable the image pickup element 4 to be easily exchanged in the case of repair. The second heat peelable adhesive layer 5 containing second heat-expandable microspheres is arranged in order to fix the image pickup elements 4 and the scintillator 6 and to enable the mage pickup elements 4 or the scintillator 6 to be easily exchanged in the case of repair. The first heat peelable adhesive layer 3 and the second heat peelable adhesive layer 5 are each a heat reaction type adhesive layer and each react with heat at a predetermined temperature or more to decrease its adhesive strength. In addition, the first heat peelable adhesive layer 3 and the second heat peelable adhesive layer 5 decrease their adhesive strengths at different temperatures. Since there are two different types of temperature conditions for decreasing the adhesive strengths, an object to be peeled off can be selected by a different heating temperature suitable therefor. In the case in which the adhesive strengths are decreased under the same conditions, for example, when the scintillator 6 is removed, after lifted up therewith, one or more image pickup elements may fall down or may come into contact with another image pickup element in some cases. The probability in which an image pickup element having no defect is broken down as described above can be reduced.

Since the heat-expandable microspheres contained in the first heat peelable adhesive layer 3 and the second heat peelable adhesive layer 5 are foamed and/or expanded by heating, an adhesion area thereof with an adherend is decreased, and the adhesion is decreased, so that the image pickup elements and/or the like can be safely separated from the first heat peelable adhesive layer 3 and the second heat peelable adhesive layer 5.

The first heat peelable adhesive layer 3 and the second heat peelable adhesive layer 5 are each formed of an adhesive and heat-expandable microspheres containing a foaming agent.

Hereinafter, the heat peelable adhesive layers will be described in detail.

As the adhesive, an appropriate adhesive, such as a rubber adhesive, an acrylic adhesive, a styrene-conjugated diene block copolymer adhesive, or a silicone adhesive, may be used, and an ultraviolet curable adhesive may also be used.

In addition, the adhesive may be blended, for example, with appropriate additives, such as a cross-linking agent, a tackifier, a plasticizer, a filler, and/or an antiaging agent, if needed.

In more particular, for example, there may be mentioned a rubber adhesive which uses at least one of natural rubbers and various types of synthetic rubbers as a base polymer and an acrylic adhesive which uses an acrylic polymer as a base polymer, the acrylic polymer including at least one component selected from an acrylic acid-based alkyl ester, such as an acrylic acid or a methacrylic acid, having an alkyl group of 20 carbon atoms or less, which generally indicates a methyl group, an ethyl group, a propyl group, a butyl group, a 2-ethylhexyl group, an isooctyl group, an isononyl group, an isodecyl group, a dodecyl, a lauryl group, a tridecyl group, a pentadecyl group, a hexadecyl group, a heptadecyl group, an octadecyl group, a nonadecyl group, an eicosyl group, or the like; an ester of acrylic acid or a methacrylic acid, having a functional group, such as a hydroxyethyl group, a hydroxypropyl group, or a glycidyl group; acrylic acid, methacrylic acid, itaconic acid, N-methylolacrylamide, acrylonitrile, methacrylonitrile, vinyl acetate, styrene, isoprene, butadiene, isobutylene, or vinyl ether.

The adhesive is properly selected in accordance with the purpose of use, such as the adhesive strength to an adherend, and an adhesive layer which is foamed and/or expanded by heating can be formed by blending a foaming agent with the adhesive.

As the foaming agent, various types of agents which achieve the above purpose may be used. Accordingly, for example, a foaming agent which is foamed and/or expanded at a higher temperature than an adhesion processing temperature of the adhesives may be used. As examples of the foaming agent which may be used, decomposition type inorganic foaming agents, such as ammonium carbonate, ammonium hydrogen carbonate, sodium hydrogen carbonate, ammonium nitrite, sodium borohydride, and azides may be used.

In addition, organic foaming agents, such as an azo compound, may also be used. As examples thereof, for example, there may be mentioned alkane fluorides, such as trichloromonofluoromethane and dichloromonofluoromethane; azo compounds, such as azobisisobutyronitrile, azodicarbonamide, and barium azodicarboxylate; hydrazine compounds, such as p-toluenesulfonyl hydrazide, diphenylsulfone-3,3'-disulfonyl hydrazide, 4,4'-oxybis(benzenesulfonyl hydrazide) and allylbis(sulfonyl hydrazide); semicarbazide compounds, such as p-toluoylenesulfonyl semicarbazide and 4,4'-oxybis(benzenesulfonyl semicarbazide); triazole compounds, such as 5-morphoryl-1,2,3,4-thiatriazole; N-nitroso compounds, such as N,N'-dinitrosopentamethylenetetramine and N,N'-dimethyl-N,N'-dinitrosoterephthalamide; and other low boiling-point compounds.

Furthermore, there may also be used heat-expandable microspheres in which an appropriate substance, such as isobutane, propane, or pentane, which easily gasifies and has a thermal expansion property, is enclosed in a shell-forming material by a coacervation method, an interfacial polymerization method, or the like. The average particle diameter of heat-expandable microspheres is generally 5 to 50 micrometers. However, heat-expandable microspheres having an average particle diameter smaller than that described above may also be used.

In addition, as the shell-forming material forming the heat-expandable microspheres, for example, in general, there may be mentioned a vinylidene chloride-acrylonitrile copolymer, a poly(vinyl alcohol), a poly(vinyl butyral), a poly(methyl methacrylate), a polyacrylonitrile, a poly(vinylidene chloride), and a polysulfone. However, in the present invention, the shell-forming material may be formed of a thermal melting material or a material to be destroyed by thermal expansion.

In addition, since the image pickup element 4 must sense light emitted from the scintillator 6, the second heat peelable adhesive layer 5 has optical transmission properties. Furthermore, the heat peelable adhesive layer 5 preferably has a high transmittance. When the light emitted from the scintillator 6 is visible light, the second heat peelable adhesive layer 5 is required to have a high transmittance of visible light, and in particular, the transmittance is preferably 90% or more at the maximum luminous wavelength of the scintillator layer 8. In addition, since a modulation transfer function (MTF) which indicates the clarity of an image is decreased as the thickness of the second heat peelable adhesive layer 5 is increased, the thickness thereof is preferably 200 micrometers or less, more preferably 50 micrometers or less, and even more preferably smaller than a pixel pitch. However, since the adhesive strength is also required, the thickness of the second heat peelable adhesive layer 5 is preferably in a range of 1 to 50 micrometers.

Figure 3:
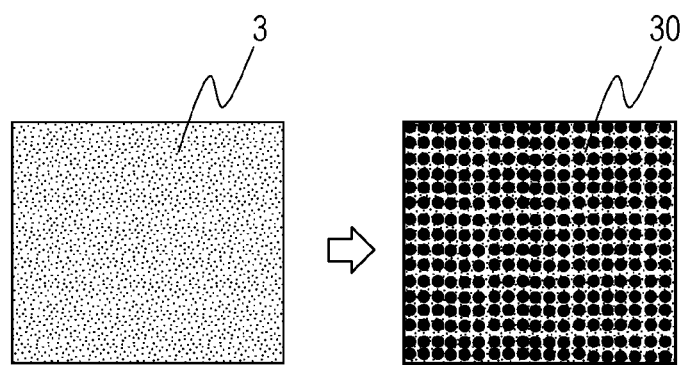
FIG. 3 is a schematic view showing the reaction/change of decrease in adhesive strength of the heat peelable adhesive layer.

FIG. 3 is a schematic view showing the reaction/change of decrease in adhesive strength of the first heat peelable adhesive layer 3. Compared to the surface of the heat peelable adhesive layer 3 before heating shown at the left side of FIG. 3, many large island-shaped particles are generated after heating as shown at the right side of FIG. 3, and as a result, a heat peelable adhesive layer 30 having a decreased adhesive strength is formed. In addition, the heat peelable adhesive layer 5 is also the same as that described above.

Figure 4:
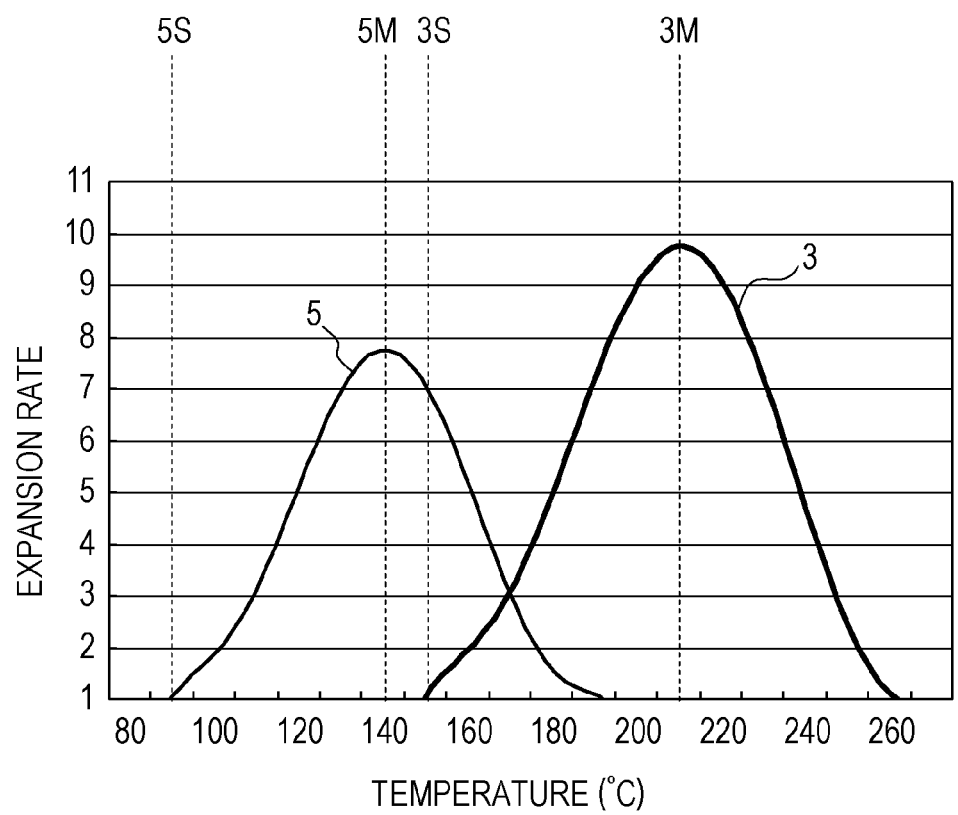
FIG. 4 is a graph showing expansion curves of heat-expandable microspheres contained in a first heat peelable adhesive layer and a second heat peelable adhesive layer.

FIG. 4 is a graph showing expansion curves of heat-expandable microspheres contained in the first heat peelable adhesive layer 3 and the second heat peelable adhesive layer 5. The vertical axis indicates an expansion rate of the heat-expandable microspheres. Of the first heat peelable adhesive layer 3 and the second heat peelable adhesive layer 5, compared to the temperature of one heat peelable adhesive layer which is first peeled off at a lower temperature side, a foaming and/or expansion starting temperature of the other heat peelable adhesive layer is preferably high. As long as the heat peelable adhesive layer which is first peeled off can be easily peeled off, the peeling thereof may be performed at a temperature between the foaming and/or expansion starting temperature and the maximum expansion temperature. In particular, it is preferable that a foaming and/or expansion starting temperature 5S of the second heat peelable adhesive layer 5 be different from a foaming and/or expansion starting temperature 3S of the first heat peelable adhesive layer 3 and be lower than that by 20 degrees or more. In other words, 3S is preferably a foaming and/or expansion starting temperature higher than 5S by 20 degrees or more, and hence, the first and the second heat peelable adhesive layers 3 and 5 can be easily peeled off in a desired order. FIG. 4 shows an example in which the foaming and/or expansion starting temperature 3S of the first heat peelable adhesive layer 3 is higher than a maximum expansion temperature 5M of the second heat peelable adhesive layer 5. By the temperature relationship as described above, when one adhesive layer is peeled off, the peeling of the other adhesive layer is not started, and hence, safer peeling can be performed. In addition, the temperature relationship described above is particularly effective when at least one of a plurality of image pickup elements is peeled off. In addition, it is not always necessary to increase the temperature to a maximum expansion temperature 3M of the first heat peelable adhesive layer 3. In this embodiment, although the second heat peelable adhesive layer 5 contains heat-expandable microspheres which start foaming and/or expansion at a low temperature as compared to that of the first heat peelable adhesive layer 3, the temperature relationship may be reversed. In this case, the base and the scintillator are peeled off from the image pickup elements in this order.

Next, with reference to schematic cross-sectional views of FIGS. 5A to 5F each illustrating a step, a method for manufacturing the radiation image pickup apparatus 1 will be described.

First, the image pickup elements 4 to each of which the wiring board 10 is connected, the base 2, and the scintillator 6 are prepared (not shown). In the manufacturing method of this embodiment, the image pickup element 4 uses a CMOS sensor including a silicon substrate, the base 2 uses a glass, and the scintillator 6 uses CsI:Tl.

Figure 5A:
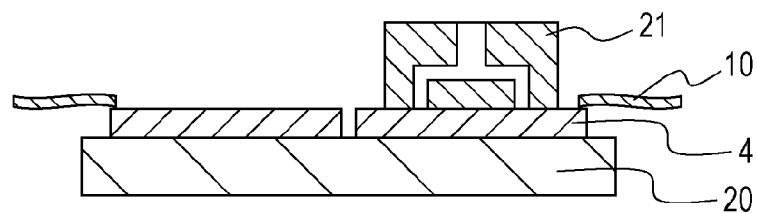
FIG. 5A is a cross-sectional view illustrating a method for manufacturing the radiation image pickup apparatus according to Embodiment 1.

FIG. 5A shows an adsorption step of adsorbing the image pickup element 4 arranged on a stage 20 by a conveying device 21.

The stage 20 fixes the image pickup elements 4 by suction so as not to disturb the arrangement of each image pickup element 4.

Figure 2A:
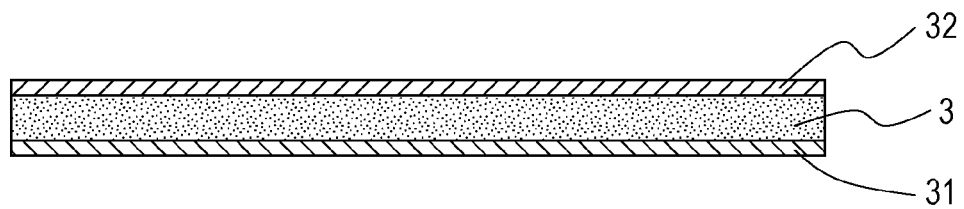
FIG. 2A is a cross-sectional view showing a sheet of a heat peelable adhesive layer provided with separators.
Figure 5B:
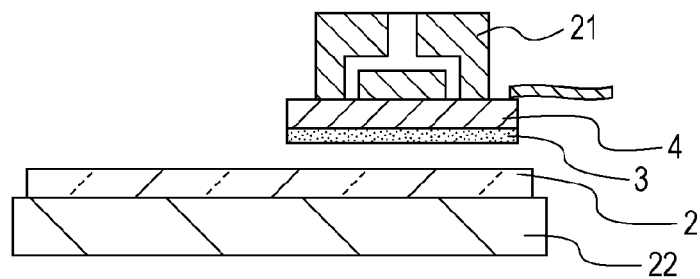
FIG. 5B is a cross-sectional view illustrating the method for manufacturing the radiation image pickup apparatus according to Embodiment 1.

FIG. 5B shows a fixing step of adhering the image pickup element 4 on the base 2 fixed on a stage 22 with the first heat peelable adhesive layer 3 used as a fixing member. The first heat peelable adhesive layer 3 used as a fixing member is a material which decreases its adhesive strength by heating. After the separators 31 and 32 shown in FIG. 2A are peeled off, the first heat peelable adhesive layer 3 is fixed to the image pickup element 4. Although the first heat peelable adhesive layer 3 used as a fixing member is arranged at the image pickup element 4 side in FIG. 5B, it may be arranged at the base 2 side. In addition, the "fixing" in this specification indicates, besides the structure in which only the first heat peelable adhesive layer 3 is arranged between the base 2 and the image pickup element 4, the structure in which at least one another material is arranged therebetween.

Figure 5C:
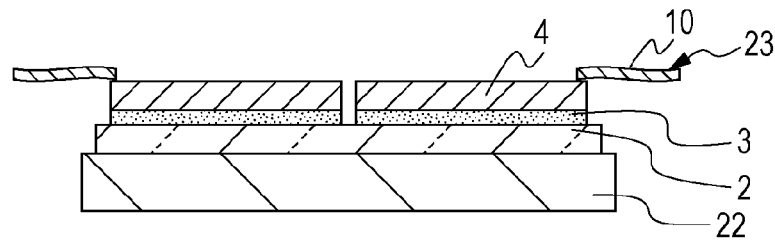
FIG. 5C is a cross-sectional view illustrating the method for manufacturing the radiation image pickup apparatus according to Embodiment 1.

FIG. 5C shows a first inspection step of inspecting the image pickup elements 4 which is performed after the above fixing step is repeated predetermined times to arrange the image pickup elements 4. The inspection is performed such that the image pickup element 4 is irradiated with visible light, and a signal is read by a probe 23. When abnormality is discovered in one image pickup element 4 in this step, this image pickup element having a defect is exchanged by heating the first heat peelable adhesive layer 3. "The image pickup element having a defect" includes an image pickup element that exhibits an operation and/or an image outside the acceptable range due to generation of static electricity, involvement of foreign substances, and/or the like during mounting. The "repair" includes a work required to exchange an image pickup element having a defect and is also called "rework".

Figure 2B:
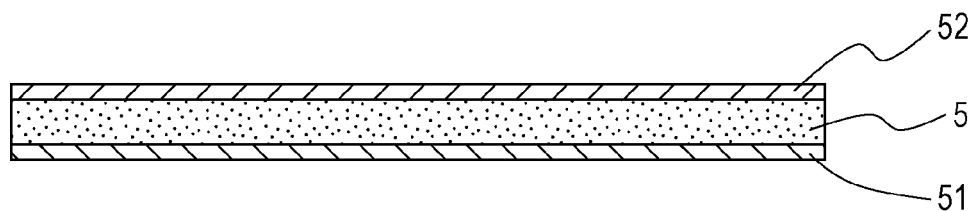
FIG. 2B is a cross-sectional view showing a sheet of a heat peelable adhesive layer provided with separators.
Figure 5D:
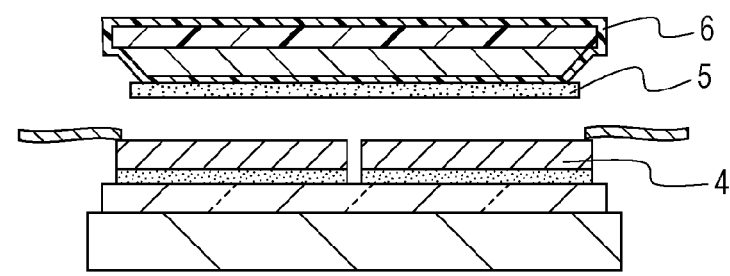
FIG. 5D is a cross-sectional view illustrating the method for manufacturing the radiation image pickup apparatus according to Embodiment 1.

FIG. 5D shows a fixing step of adhering the scintillator 6 with the second heat peelable adhesive layer 5 to be used as a fixing member. After the separators 51 and 52 shown with FIG. 2B are peeled off, the second heat peelable adhesive layer 5 is fixed to the scintillator 6. Although the second heat peelable adhesive layer 5 used as a fixing member is arranged at the scintillator 6 side in FIG. 5D, it may be arranged at the image pickup element 4 side. A material for the second heat peelable adhesive layer 5 has a foaming and/or expansion starting temperature lower than that of a material for the first heat peelable adhesive layer 3 by 20 degrees. A material having a lower foaming and/or expansion starting temperature by 20 degrees or more, such as 50 degrees, is naturally used.

Figure 5E:
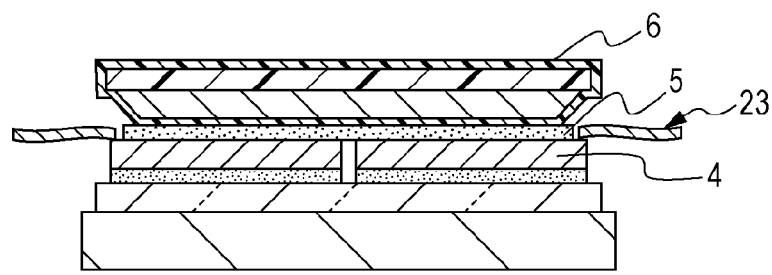
FIG. 5E is a cross-sectional view illustrating the method for manufacturing the radiation image pickup apparatus according to Embodiment 1.
Figure 6A:
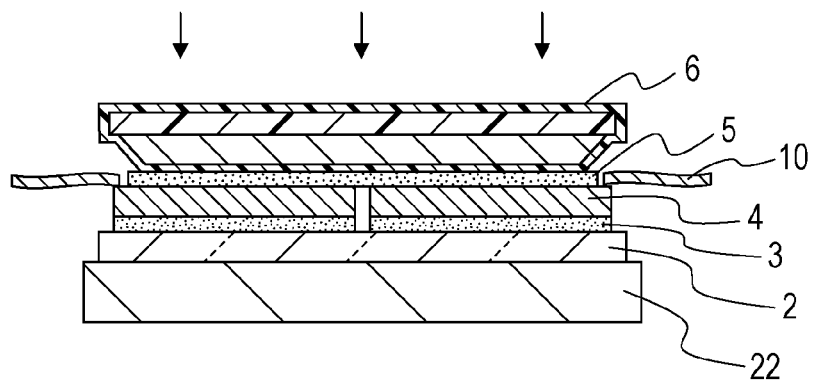
FIG. 6A is a cross-sectional view illustrating the method for manufacturing the radiation image pickup apparatus according to Embodiment 1.
Figure 6B:
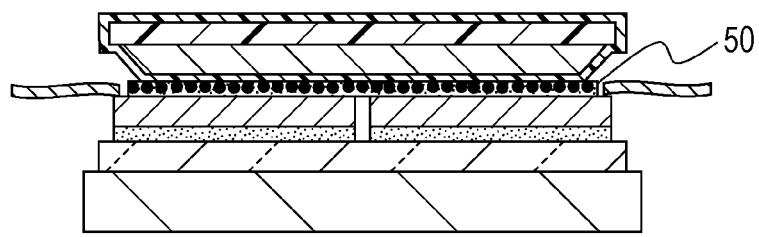
FIG. 6B is a cross-sectional view illustrating the method for manufacturing the radiation image pickup apparatus according to Embodiment 1.
Figure 6C:
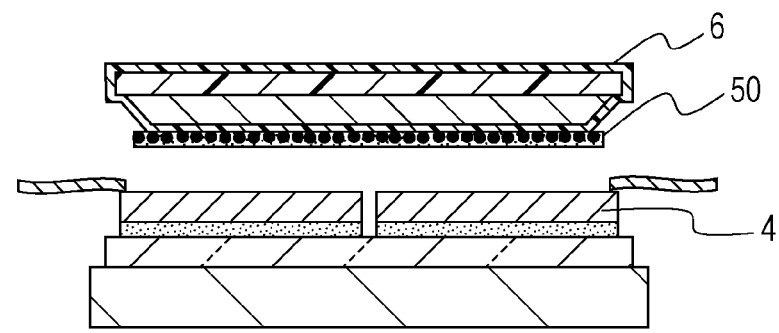
FIG. 6C is a cross-sectional view illustrating the method for manufacturing the radiation image pickup apparatus according to Embodiment 1.
Figure 7A:
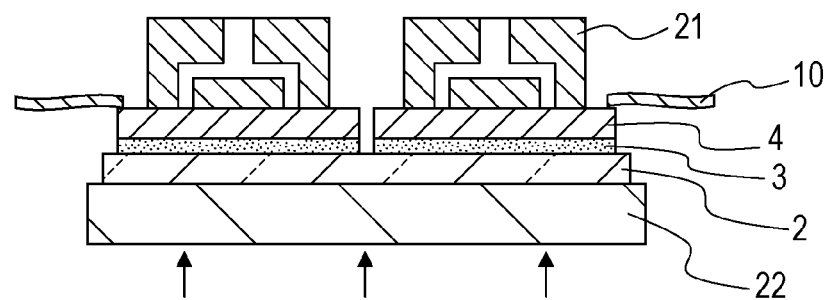
FIG. 7A is a cross-sectional view illustrating the method for manufacturing the radiation image pickup apparatus according to Embodiment 1.
Figure 7B:
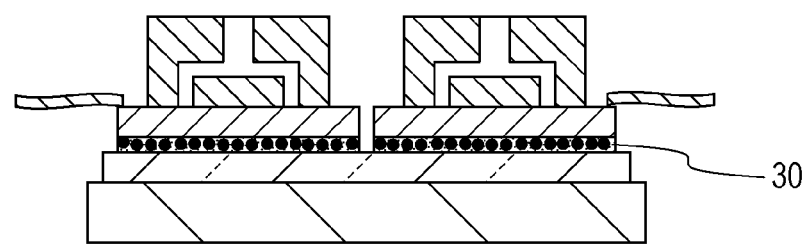
FIG. 7B is a cross-sectional view illustrating the method for manufacturing the radiation image pickup apparatus according to Embodiment 1.
Figure 7C:
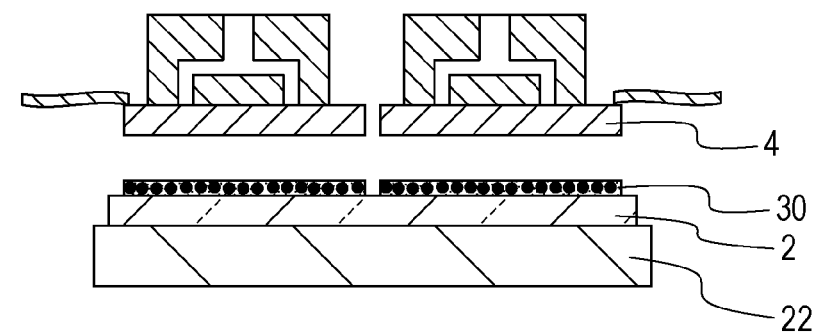
FIG. 7C is a cross-sectional view illustrating the method for manufacturing the radiation image pickup apparatus according to Embodiment 1.

FIG. 5E shows a second inspection step of the image pickup elements 4 performed after the base 2, the image pickup elements 4, and the scintillator 6 are fixed. The inspection is performed such that the scintillator 6 is irradiated with radiation rays, and a signal is read by the probe 23. At this stage, the image pickup elements are checked whether having a defect or not, and when judged as a defective product, this image pickup element is exchanged. Furthermore, the scintillator 6 is also inspected. When it is judged that the image is adversely affected due to the defect of the scintillator 6, the scintillator 6 is exchanged. Peeling of the image pickup elements 4 and the scintillator 6 will be described with reference to FIGS. 6A to 7C. FIGS. 6A to 6C are each a cross-sectional view showing a first heat separation step of separating the scintillator 6 and the image pickup elements 4. FIG. 6A shows the state in which a radiation image pickup apparatus having a laminated structure is heated which includes the base 2, the first heat peelable adhesive layers 3, the image pickup elements 4, the second heat peelable adhesive layer 5, and the scintillator 6 on the stage 22 in this order. Heating is performed using an oven which can control an ambient temperature of the periphery of the radiation image pickup apparatus. Other heating methods may also be used, and for example, heating may be performed by thermal conduction such that a heater is arranged above the scintillator 6. Accordingly, as shown in FIG. 6B, the second heat peelable adhesive layer 5 is changed by heating into a second heat peelable adhesive layer 50 having a decreased adhesive strength. As a result, as shown in FIG. 6C, the scintillator 6 can be easily removed from the image pickup elements 4. At this stage, since fixed by the first heat peelable adhesive layers 3, the image pickup elements 4 are each placed in a safe state. FIGS. 7A to 7C are each a cross-sectional view showing a second heat separation step for separating the image pickup elements 4 and the base 2. FIG. 7A shows the state in which a device having a laminated structure which includes the base 2, the first heat peelable adhesive layers 3, and the image pickup elements 4 on the stage 22 in this order is heated (is irradiated with infrared rays from the stage 22 side). Other heating methods may also be used, and for example, heating may be performed in an oven, or heating may be performed by thermal conduction such that a heater is arranged at a rear side of the base 2. In addition, as shown in FIG. 7B, the first heat peelable adhesive layers 3 are each changed by heating into the first heat peelable adhesive layer 30 having a decreased adhesive strength. As a result, as shown in FIG. 7C, the image pickup elements 4 can be easily removed from the base 2. When the surfaces of the image pickup elements 4 opposite to the base 2 are fixed by a conveying device or the like, and heating is performed, one or more desired image pickup elements 4 can then be safely removed. In addition, as shown in the figure, when the first heat peelable adhesive layers 3 are separately provided for the individual image pickup elements, only an image pickup element 4 to be exchanged can be easily removed. In this case, since an image pickup element 4 having no defect can be effectively used, cost can be reduced. When the image pickup element having a defect is exchanged, naturally, a new image pickup element and the scintillator are fixed with the heat peelable adhesive layers as shown in FIGS. 5A to 5E.

Figure 5F:
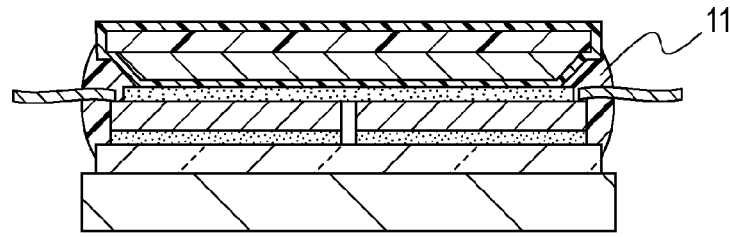
FIG. 5F is a cross-sectional view illustrating the method for manufacturing the radiation image pickup apparatus according to Embodiment 1.

FIG. 5F shows a sealing step of sealing the periphery of a radiation image pickup apparatus having no defect, which is confirmed by the above inspection step, with the resin 11. The image pickup elements are sealed by this step. Since fixed by the resin 11 in the sealing step, the wiring boards 10 penetrate the resin 11. The strength can be improved so that the base 2 and the scintillator 6 are not easily separated from each other, and the reliability can be improved by suppressing the entry of moisture and the like from the outside.

As described above, a radiation image pickup apparatus in which one or more image pickup elements are easily exchanged can be obtained. In addition, since the amount of residue of the fixing member is small on the surface of the base from which the image pickup element is removed, a next image pickup element can be easily fixed on the above surface.

Embodiment 2

Figure 8:
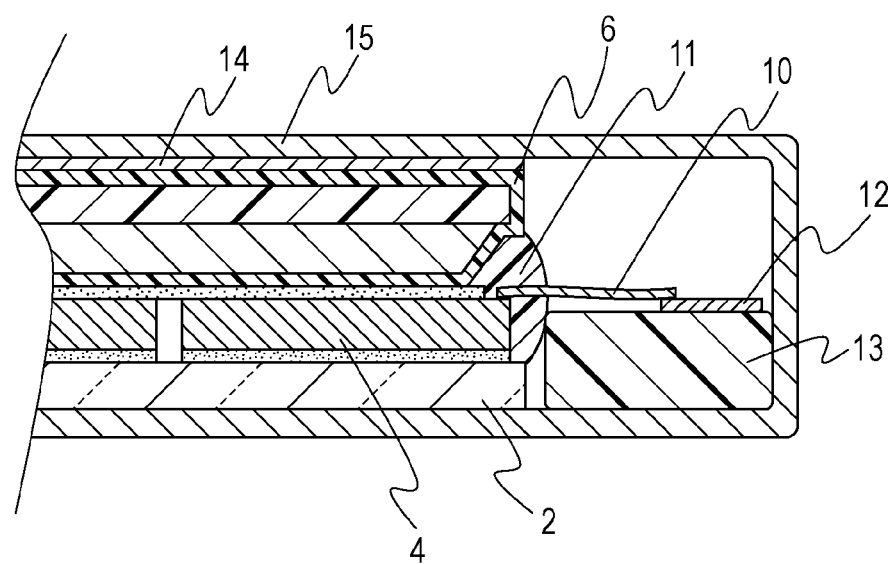
FIG. 8 is a partial cross-sectional view of a radiation image pickup apparatus according to Embodiment 2.

FIG. 8 is a partial cross-sectional view of a radiation image pickup apparatus according to Embodiment 2. In the radiation image pickup apparatus shown in FIG. 8, the same constituent elements as those of the radiation image pickup apparatus shown in FIGS. 1A and 1B will be designated by the same reference numerals as those described above, and detailed description thereof will be omitted. The apparatus described in Embodiment 1 is placed in a housing 15. Image pickup elements 4 are each a CMOS sensor formed on a silicon substrate. A wiring board 10 is a FPC. A base 2 is a glass which transmits ultraviolet rays. A scintillator 6 has CsI:Tl as a scintillator layer. In addition, in the housing 15, the base 2, the image pickup elements 4, and the scintillator 6 are arranged, and a buffer material 14 is arranged between the scintillator 6 and the housing 15. A circuit element 12 which transfers and processes a signal is arranged for the image pickup element 4 through the wiring board 10. In addition, a buffer material 13 is arranged at side surfaces of a resin 11. The resin 11 and the buffer material 13 are preferably formed of a black resin which absorbs the wavelength of light to be sensed by the image pickup element 4. In addition, the buffer material 13 preferably surrounds all the peripheries of the resin 11. By the structure as described above, light from a light emitting element of a different circuit board can be prevented from entering the image pickup element 4 through the base 2 or the like as stray light, and the image quality can be suppressed from being degraded.

Embodiment 3

Figure 9:
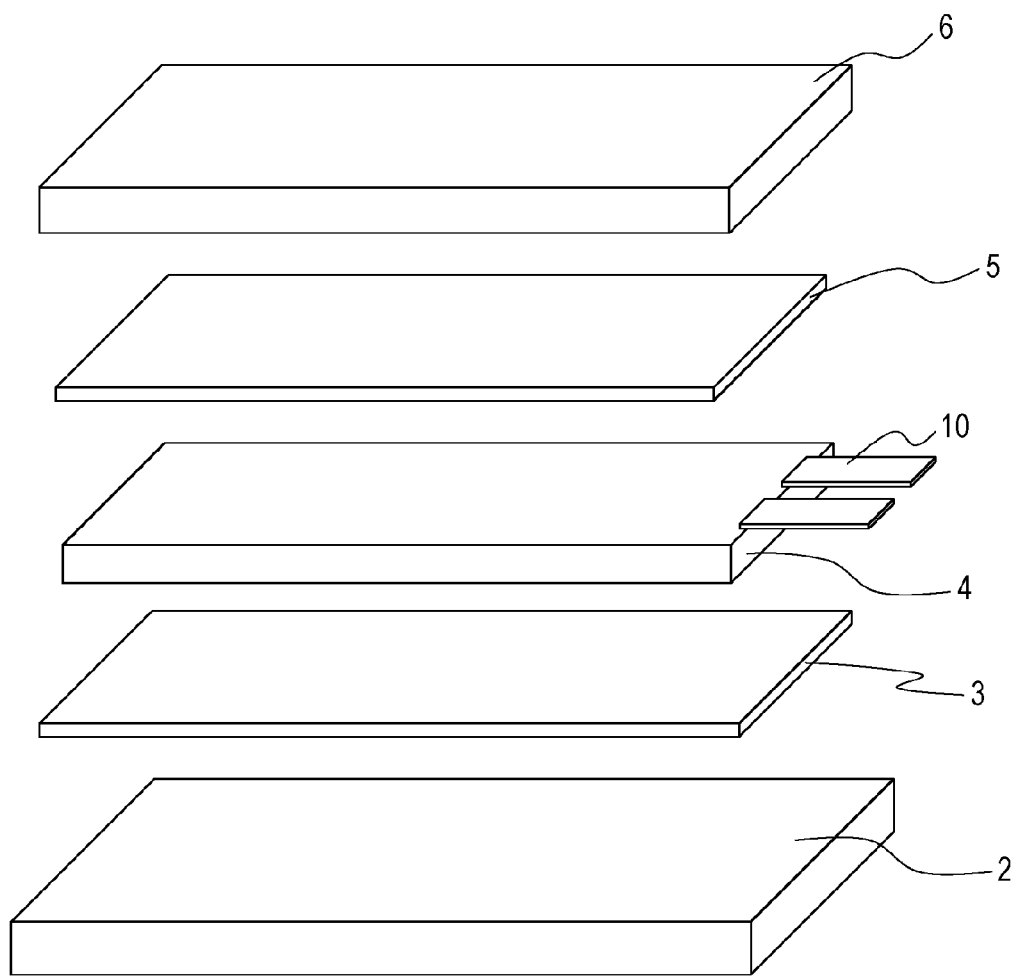
FIG. 9 is an exploded perspective view of a radiation image pickup system according to Embodiment 3.
Figure 10:
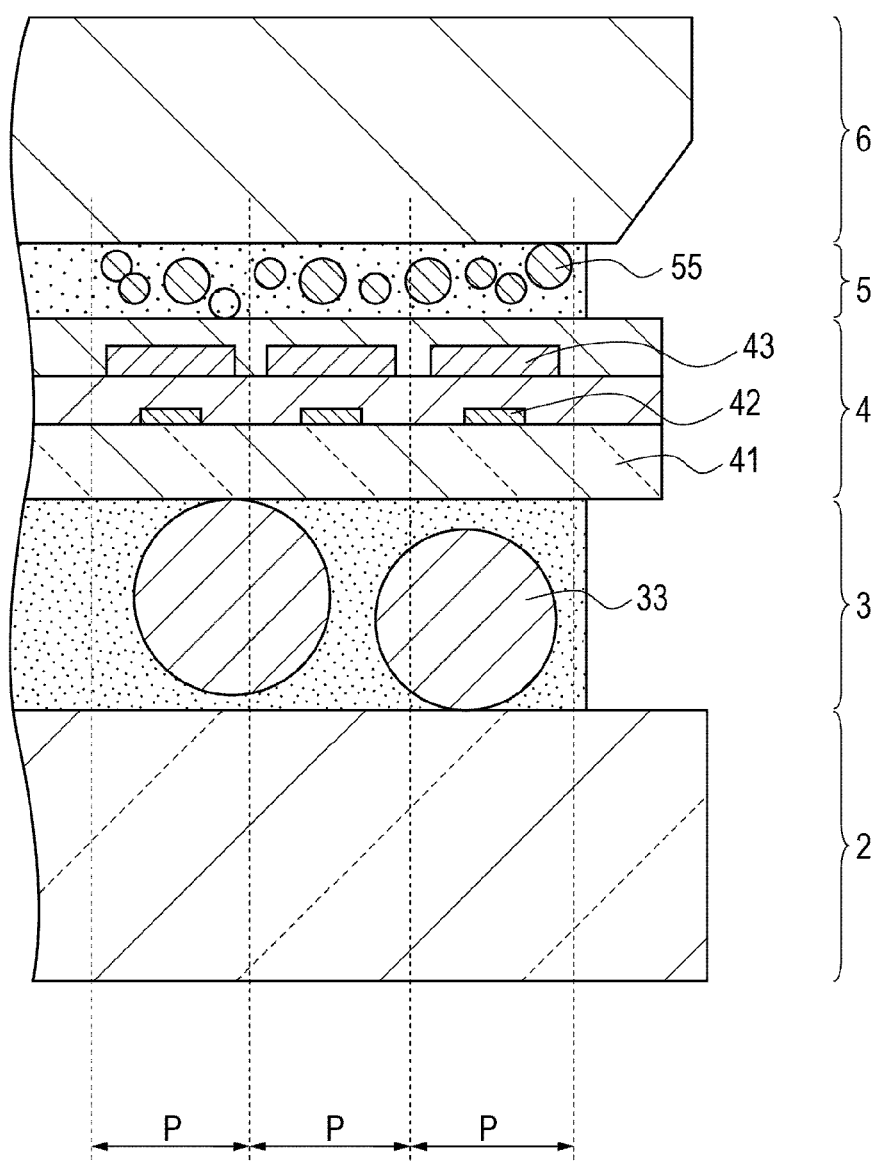
FIG. 10 is a partial cross-sectional view of the radiation image pickup apparatus according to Embodiment 3.

FIG. 9 is an exploded perspective view of a radiation image pickup apparatus according to Embodiment 3. FIG. 10 is a partial cross-sectional view of the radiation image pickup apparatus of this embodiment. In the radiation image pickup apparatus of this embodiment, the same constituent elements as those of the radiation image pickup apparatus shown in FIGS. 1A and 1B are designated by the same reference numerals as those described above, and detailed description thereof will be omitted.

In this embodiment, the radiation image pickup apparatus includes one image pickup element. In an image pickup element 4, a switching element 42 and a photoelectric transducer 43 are arranged on a glass substrate 41.

A heat-expandable microsphere 33 of a first heat peelable adhesive layer 3 is larger than a pixel pitch P, and a heat-expandable microsphere 55 of a second heat peelable adhesive layer 5 is smaller than the pixel pitch P.

Since the average particle diameter of the heat-expandable microspheres 55 of the second heat peelable adhesive layer 5 is smaller than the pixel pitch P of the image pickup element 4, light scattered by the heat-expandable microspheres 55 is not spread widely. Hence, a decrease in the modulation transfer function (MTF) of an obtained image can be suppressed. On the other hand, for example, if the average particle diameter of the second heat-expandable microspheres 55 is set larger than the pixel pitch as the first heat-expandable microspheres 33 shown in the figure, light from the scintillator 6 is widely scattered. Accordingly, easy peeling properties, that is, easy exchanging properties, and good image quality can be obtained at the same time.

Embodiment 4

Figure 11:
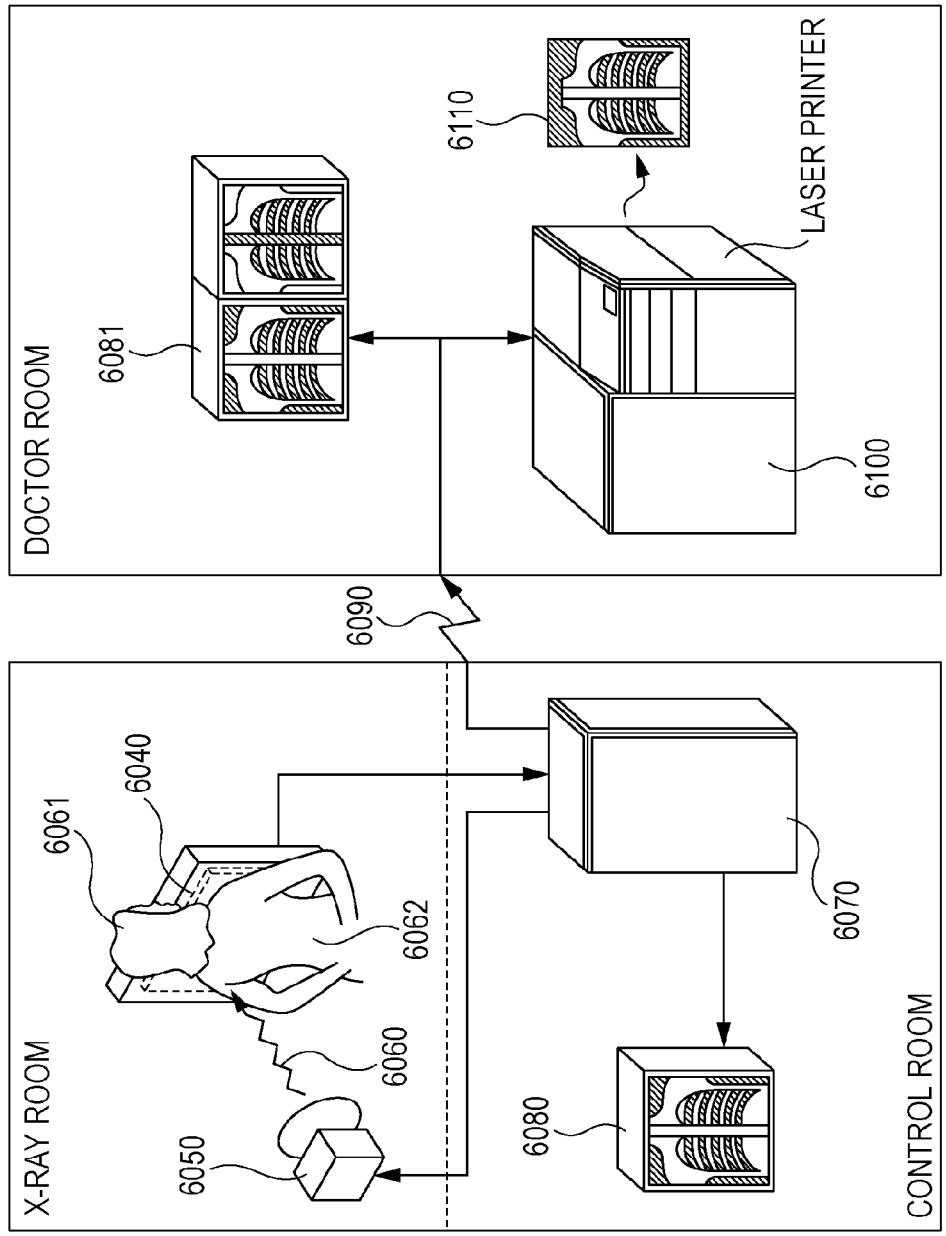
FIG. 11 is a schematic view illustrating a radiation image pickup system according to Embodiment 4.

FIG. 11 is a schematic view showing one application example of an x-ray radiation image pickup apparatus according to the present invention applied to an X-ray diagnostic system (radiation image pickup system). X-rays 6060 generated by an X-ray tube 6050 (radiation source) transmit a chest portion 6062 of a patient or a subject 6061 and are incident on an image sensor 6040 (radiation image pickup apparatus) including a scintillator mounted at an upper side. The information inside the body of the patient 6061 is included in the incident X-rays. Corresponding to the incidence of X-rays, the scintillator emits light, and this light is photoelectrically converted, so that electrical information is obtained. This information is converted into a digital signal, is processed by image processing using an image processor 6070, which is a signal processing device, and is then observed on a display 6080, which is a display device in a control room. In addition, the radiation image pickup system includes at least the radiation image pickup apparatus and the signal processing device which processes a signal from the radiation image pickup apparatus.

In addition, this information can be transferred to a remote location by a transmission processing device, such as a telephone line 6090, and can be displayed on a display 6081 functioning as a display device in a doctor room at a different location or can be stored in a recording device, such as an optical disc, and a doctor at the remote location is able to diagnose the information. In addition, the information can be recorded on a film 6110 functioning as a recording medium by a film processor 6100 functioning as a recording device. Furthermore, the information can also be printed on paper by a laser printer functioning as a recording device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-142950, filed Jun. 23, 2010, which is hereby incorporated by reference herein in its entirety.

The invention claimed is:

1. A radiation image pickup apparatus comprising:
   a base;
   at least one image pickup element including a plurality of pixels, each of which has a sensor portion converting light into a charge;
   a scintillator arranged on the image pickup element at a side opposite to the base;
   a first heat peelable adhesive layer which is arranged between the base and the image pickup element and which fixes the base and the image pickup element; and
   a second heat peelable adhesive layer which is arranged between the image pickup element and the scintillator and which fixes the image pickup element and the scintillator,
   wherein the first heat peelable adhesive layer contains first heat-expandable microspheres, the second heat peelable adhesive layer contains second heat-expandable microspheres, and the first heat-expandable microspheres have a different expansion starting temperature from that of the second heat-expandable microspheres.

2. The radiation image pickup apparatus according to claim 1, wherein the expansion starting temperature of the first heat-expandable microspheres is different from that of the second heat-expandable microspheres by 20 degrees or more.

3. The radiation image pickup apparatus according to claim 1, wherein the expansion starting temperature of the second heat-expandable microspheres is lower than that of the first heat-expandable microspheres.

4. The radiation image pickup apparatus according to claim 1, wherein the pixels are arranged at a pixel pitch P, and the average particle diameter of the second heat-expandable microspheres is smaller than the pixel pitch P.

5. The radiation image pickup apparatus according to claim 4, wherein the average particle diameter of the second heat-expandable microspheres is 50 micrometers or less, and the thickness of the second heat peelable adhesive layer is in a range of 1 to 50 micrometers.

6. The radiation image pickup apparatus according to claim 1, further comprising a resin arranged between the base and the scintillator to surround the periphery of the image pickup element.

7. The radiation image pickup apparatus according to claim 6, further comprising a wiring board which penetrate the resin and which is connected to the image pickup element.

8. The radiation image pickup apparatus according to claim 1, wherein a plurality of the image pickup elements are fixed the base, and the first heat peelable adhesive layer is arranged for each of the image pickup elements.

9. The radiation image pickup apparatus according to claim 1, wherein the second heat peelable adhesive layer has optical transmission properties which transmit light from the scintillator.

10. A radiation image pickup system comprising:
the radiation image pickup apparatus according to claim 1; and
an image processor the processing a signal from the radiation image pickup apparatus.

11. A method for manufacturing a radiation image pickup apparatus, comprising the steps of:
preparing a base;
preparing at least one image pickup element including a plurality of pixels, each of which has a sensor portion converting light into a charge;
preparing a scintillator;
fixing the base and the image pickup element with a first heat peelable adhesive layer containing first heat-expandable microspheres provided therebetween; and
fixing the scintillator on the image pickup element at a side opposite to the base with a second heat peelable adhesive layer containing second heat-expandable microspheres provided therebetween,
wherein the second heat-expandable microspheres have a different expansion starting temperature from that of the first heat-expandable microspheres.

12. The method for manufacturing a radiation image pickup apparatus according to claim 11, further comprising the steps of:
inspecting the image pickup element fixed to the base; and
when the image pickup element is judged as a defective image pickup element in the inspecting step, peeling the scintillator by expanding the second heat-expandable microspheres having a lower expansion starting temperature than that of the first heat-expandable microspheres by heating.

13. The method for manufacturing a radiation image pickup apparatus according to claim 12, further comprising the step of, after the step of peeling the scintillator is performed:
peeling the image pickup element having a defect by expanding the first heat-expandable microspheres by heating while the image pickup element having a defect is fixed.

14. A radiation image pickup apparatus comprising:
a base;
a plurality of image pickup elements, each of the plurality of image pickup elements including a plurality of pixels, each of the plurality of pixels having a sensor portion converting light into a charge;
a scintillator arranged on the image pickup element at a side opposite to the base; and
a heat peelable adhesive layer which fixes the base and one of the plurality of image pickup elements,
wherein the heat peelable adhesive layer comprises heat-expandable microspheres, and the heat peelable adhesive layer is arranged for each of the plurality of image pickup elements.

15. A radiation image pickup system comprising:
the radiation image pickup apparatus according to claim 1; and
an image processor the processing a signal from the radiation image pickup apparatus.

* * * * *